United States Patent [19]

Battjes

[11] 3,868,580

[45] Feb. 25, 1975

[54] BOOTSTRAPPED AMPLIFIER

[75] Inventor: Carl R. Battjes, Portland, Oreg.

[73] Assignee: Tektronix, Inc., Beaverton, Oreg.

[22] Filed: Feb. 12, 1973

[21] Appl. No.: 332,052

[52] U.S. Cl. ........................ 330/18, 330/15, 330/26, 330/156

[51] Int. Cl. ............................ H03f 3/42, H03f 1/00

[58] Field of Search ........... 330/15, 18, 26, 70, 156; 328/176

[56] References Cited

UNITED STATES PATENTS

| | | | |
|---|---|---|---|
| 3,454,888 | 7/1969 | Waldhauer | 330/18 X |
| 3,622,899 | 11/1971 | Eisenberg | 330/18 X |
| 3,631,267 | 12/1971 | Heimbigner | 328/176 X |

*Primary Examiner*—Rudolph V. Rolinec
*Assistant Examiner*—Lawrence J. Dahl
*Attorney, Agent, or Firm*—Adrian J. LaRue

[57] ABSTRACT

A bootstrapped amplifier including an al1-NPN floating current source, an output current steering circuit, and an active feedback network has the capability of providing large, fast voltage changes efficiently and accurately on capacitive loads. Therefore, while the amplifier operates with low quiescent currents, it can supply large load currents of either polarity on demand. Because all of the transistors are of one conductivity type, and few additional components are required, the circuit is especially compatible to standard integrated circuit fabrication methods.

11 Claims, 3 Drawing Figures

BOOTSTRAPPED AMPLIFIER

BACKGROUND OF THE INVENTION

It was recognized early in the development of transistors that the performance characteristics of complementary amplifiers were extremely advantageous over other types of amplifiers in that complementary amplifiers could operate at comparatively low quiescent currents and yet provide large load currents of either polarity on demand. Complementary amplifiers, of which those disclosed in U.S. Pat. No. 2,666,818, granted Jan. 19, 1954, to William Shockley and U.S. Pat. No. 2,791,644, granted May 7, 1957, To George C. Sziklai are illustrative, comprise a pair of transistors of opposite-polarity conductivity types, one being a PNP transistor and the other being an NPN transistor. These amplifiers were operable with the output taken from either a pair of directly-connected collectors or from a pair of directly-connected emitters, depending upon the impedance and gain requirements of the circuit. The input signal could be applied to the base of one or both transistors.

Various improvements to the complementary amplifier have been made. Of particular note is the use of active feedback to provide accurate control of large voltage swings and yet conserve standing current and power consumption. Such an amplifier, as disclosed in U.S. Pat. application Ser. No. 844,370, filed July 24, 1969, is capable of providing sufficient displacement current for charging the capacitance represented by the deflection plates of a cathode-ray tube. However, for integrated-curcuit applications in high-speed oscillography, the inherent slow response characteristic of the PNP transistor in integrated-circuit form was a limiting factor.

In one previous attempt to provide a circuit using all NPN devices and capable of supplying large load currents of either polarity, a feedback amplifier arrangement including an emitter follower output and a reverse-connected diode was constructed, wherein the emitter follower provided one polarity of current and the diode provided the other polarity. The major drawback to this configuration is that a dead zone results during the switching time of the devices as the polarity changes. The aberration on a waveform resulting from this dead zone cannot be tolerated in precision instruments where distortionless waveform accuracy is required. The second drawback to this configuration is the excessive consumption of power due to the resistive feedback network.

SUMMARY OF THE INVENTION

According to the present invention, a constant power bootstrapped amplifier overcomes the aforementioned disadvantages, and provides additional advantages as well. It is constructed of all NPN active devices, including a floating current source and an output current steering circuit. The preferred embodiment of this invention also includes transistors connected in the well-known totem pole configuration to obtain a voltage swing larger than normal collector-base breakdown voltages, and an active feedback network to reduce output standing current and output signal current swing. The amplifier has increased bandwidth capabilities, operates at low quiescent current, consumes comparatively little power, provides large, fast voltage changes efficiently and accurately on capacitive loads, and supplies large load currents of either polarity on demand.

The current source maintains the high slew rate over a large portion of the dynamic range of the amplifier by providing nearly a constant current even as the range limits are approached. Because of the constant current source, the amplifier can be expanded quite easily to handle larger voltage swings by stacking additional transistors in totem-pole fashion. The current steering circuit establishes a constant quiescent current at the output and provides a path for large pull-up and pull-down currents without dead band distortion. The active feedback network in the preferred embodiment reduces both the output loading and power dissipation. Because the amplifier of the present invention is comprised of all NPN active devices, it can be realized in a standard monolithic integrated circuit to achieve additional advantages.

It is therefore one object of the present invention to provide an improved amplifier constructed of all NPN devices which exhibits the advantageous characteristics of typical complementary amplifiers and has increased bandwidth capabilites thereover when constructed in integrated-circuit form.

It is another object of the present invention to provide an improved amplifier circuit wherein the power and current capabilities are conserved for driving a displacement current load.

It is a further object of the present invention to provide an improved amplifier wherein dynamic voltage output range cna be increased without distortion by stacking additional transistors.

It is a yet another object of the present invention to provide an all NPN amplifier capable of substantially constant-current, constant-power operation, yet also capable of supplyinng large load currents of either polarity.

It is yet a further object of the present invention to provide an improved amplifier circuit which is capable of providing large, fast voltage changes efficiently and accurately on capacitive loads without dead band distortion.

It is still another object of the present invention to provide an improved feedback amplifier which is responsive to large-amplitude signals while maintaining a substantially low quiescent current or which is operable at high signal rates with the same quiescent current.

It is still a further object of the present invention to provide an amplifier circuit having characteristics of typical complementary amplifiers which can be implemented in a standard monolithic integrated circuit.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figure 1:
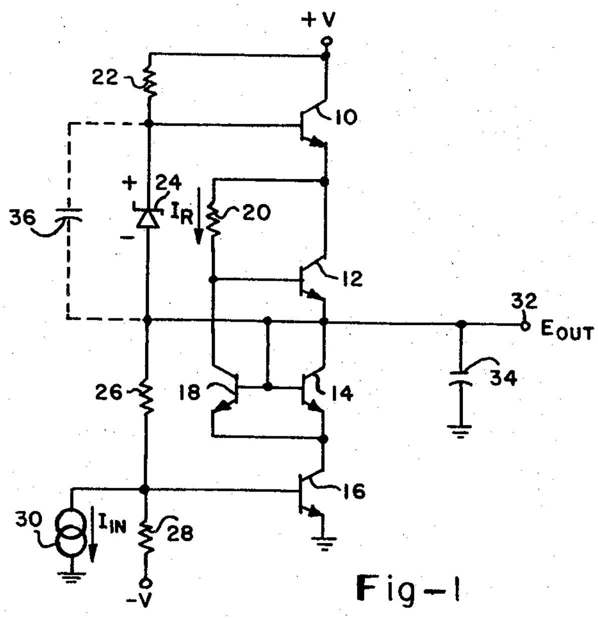
FIG. 1 is a schematic of a basic constant-power bootstrapped amplifier circuit according to the present invention.

Referring to FIG. 1, a constant-power bootstrapped amplifier circuit according to the present invention comprises five transistors 10, 12, 14, 16, and 18, all suitably of the NPN type, four of which are serially stacked in an emitter-to-collector relationship between a suitable positive supply voltage and a suitable return level to form a first conductive path. The collector of transistor 10 is connected to the positive supply, and its emitter is connected to the collector of transistor 12. The emitter of transistor 12 is connected to the collector of transistor 14, whose emitter is connected to the collector of transistor 16. The emitter of transistor 16 is connected to ground return. A resistor 20 is interposed between the emitter of transistor 10 and the collector of transistor 18. The junction of resistor 20 and the collector of transistor 18 is connected to the base of transistor 12. The base and emitter of transistor 18 are connected respectively to the base and emitter of transistor 14.

A second conductive path, including resistor 22, Zener diode 24, and resistor 26 and 28 serially connected between a suitable positive supply voltage and a negative supply voltage, comprises a voltage divider to establish the operating bias for the transistors of the first conductive path. The junction between resistor 22 and the cathode end of Zener diode 24 is suitably connected to the base of transistor 10, the junction between the anode end of Zener diode 24 and resistor 26 is connected to the bases of transistors 14 and 18, and the junction between 26 and 28 is connected to the base of transistor 16.

An input current source 30 is connected to the junction of resistors 26 and 28 and hence to the base of transistor 16. An output terminal 32 is connected to the junction including the other end of resistor 26, the anode end of Zener diode 24, the bases of transistors 14 and 18, the emitter of transistor 12, and the collector of transistor 14. Capacitor 34 represents a capacitive load connected to the circuit output.

Quiescently, the circuit operates as follows. A constant voltage drop is established across Zener diode 24 in the second conductive path mentioned previously, hence a constant voltage difference is maintained between the base of transistor 10 and the emitter of transistor 12. This constant voltage difference, minus the base-emitter drops of transistors 10 and 12, is developed across resistor 20, establishing a constant current therethrough. This current is identified in FIG. 1 as $I_{RZ}$. Essentially all of this current flows through transistor 18. The standing current through transistor 16, which is equal to the $I_{RZ}$ value plus $I_{RZ}$ multiplied by the emitter area ratio of transistor 14 to transistor 18, is thus maintained at a substantially constant value.

As will be well understood by those skilled in the art, the circuit from the base of transistor 16 to the collector of transistor 14 exhibits a relatively high "open loop" gain. Resistor 26 provides a large amount of negative feedback to the base of transistor 16. Considering dynamic operation of the circuit, a virtual ground is maintained at the base of transistor 16 through feedback action. Assume an incremental increase in current $I_{IN}$ in current source 30. The increased current demanded flows through resistor 26, developing thereacross an incremental increase in voltage. Since one end of resistor 26 is fixed at virtual ground, the other end swings positive. As the collector of transistor 14, to which resistor 26 is connected, swings positive, Zener diode 24 maintains its constant voltage drop. Thus the base of transistor 10 experiences an identical incremental voltage increase, pulling up transistors 12, 14, and 18 in identical fashion. Such action is known to those skilled in the art as "bootstrapping." It can be appreciated, then, that the voltage across resistor 20 remains constant and thus the current therethrough remains constant. Hence, through bootstrapping action, resistor 20 is floating current source providing a substantially constant current through transistors 14, 16 and 18 for positive voltages at the output, allowing such changes to take place rapidly. The current required to quickly charge the load capacitor 34 to its new voltage value is drawn through transistors 10 and 12. To improve the fast-transient response of the bootstrapping circuit, a capacitor 36 may be placed in parallel with Zener diode 24.

In a similar manner, an incremental decrease in input current $I_{IN}$ results in an incremental decrease in voltage across resistor 26. The collector of transistor 14 is thereby pulled down, as is the base of transistor 10. Again the constant current through resistor 20 is maintained, maintaining substantially constant current through transistors 10, 12, and 16. The load capacitor 34 is quickly discharged through transistors 14 and 16. The output terminal can quickly swing from one voltage level to another with any distortion being produced when the load current polarity is reversed.

The circuit of FIG. 1 reduces the effective transimpedance of the amplifier. The transimpedance of the amplifier is defined as the ratio of the change in output voltage at terminal 32 to a change in input current from current source 30 for bringing about the output change. In the FIG. 1 circuit, the transimpedance is approximately equal to the resistance value of resistor 26, that is, $\Delta E_{out} \cong -I_{in}R_{26}$, which is the case for most feedback amplifier stages.

As a consequence of the low conductive loading at the output terminal, and the steering of charging current through transistor 12 to the capacitive load 34 and discharging current through transistor 14 from the capacitive load 34, less standing current need be provided to the amplifier, and consequently power drain of the circuit is minimized. The power and current capabilities are conserved for driving the displacement current load comprising, for example, the deflection plates or the unblanking grid of a cathode-ray tube.

Figure 2:
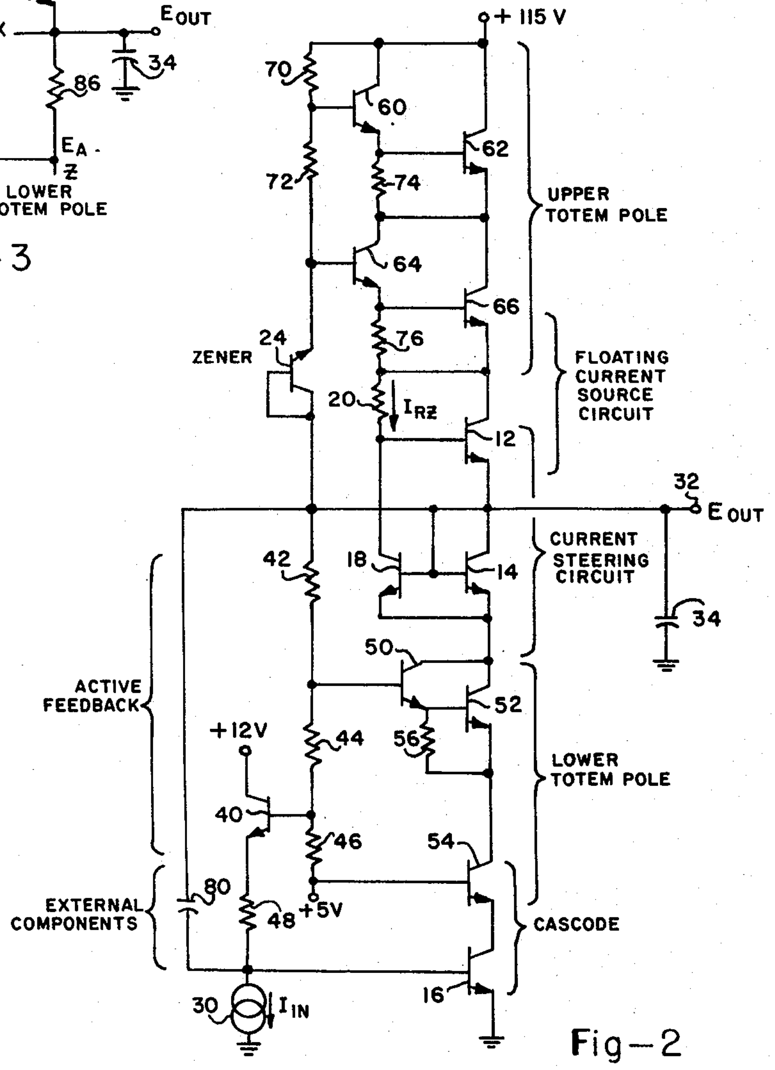
FIG. 2 is a schematic of the preferred embodiment according to the present invention.

FIG. 2 shows the preferred embodiment according to the present invention wherein like elements are referred to by like reference numerals. As will be seen, the advantages provided by the additional components include a reduction of both the output loading and power dissipation while permitting much larger voltage excursions to be handled. The passive feedback resistor is replaced by an active feedback network comprising transistor 40 and resistors 42, 44, 46, and 40. The expected incremental response is $\Delta E_{out} = \Delta I_{in} R_f$. Resistors 42, 44, and 46 comprise a voltage divider so that a sample of the output voltage $E_{out}$ at terminal 32 appears at the base of transistor 40. Assuming, for example, a divider ratio of 20:1, the tapped voltage sample is equal to ($E_{out}$/20). This sample voltage is applied via the base-emitter junction of transistor 40 to a resistor 48, whose value can be accordingly selected as the desired $R_F$ requirement divided by the voltage divider ratio, or ($R_F/20$) for this example. The bandwidth of the transimpedance is inversely proportional to the square root of $R_F$. Also, since the amount of current through resistors 42, 44, and 46 needs only to be sufficient to maintain Zener diode 24 above the knee of its operating curve, and to supply necessary transistor base currents, these resistors can be chosen to have relatively high values. Consequently, the output current drain is reduced, resulting in a reduction of power dissipation. Furthermore, since the chosen high values of resistors 42, 44, and 46 parallel the load, the output loading is reduced.

In addition to the active feedback network just described, several transistors and their associated biasing resistors are added to enable the amplifier circuit to handle much larger voltage swings. Transistors 50, 52, and 54 are connected into the circuit between the emitters of transistors 14 and 18 and the collector of transistor 16. Transistors 50 and 52 comprise a Darlington pair to increase the voltage range while minimizing loading of the voltage divider comprising the feedback path throughout the frequency range. The base of transistor 50 is appropriately connected between resistors 42 and 44 to establish the operating point. Resistor 56 is connected across the base-emitter junction of transistor 52 to increase the breakdown voltage of the Darlington combination by providing a current path for transistor 52 reverse base current as the $BV_{CEO}$ of the transistor is exceeded during large voltage excursions, thereby increasing the voltage the amplifier can withstand without causing breakdown. Thus transistors 50 and 52 comprise the lower totem pole configuration. Transistor 54 is connected as a grounded-base stage between the emitter of transistor 52 and the collector of transistor 16 to minimize the Miller effects for transistor 16; transistors 16 and 54 thereby operate as a cascode stage.

The upper totem pole stage comprising transistors 60, 62, 64, and 66 function in a manner similar to that described for the lower totem pole stage. Resistors 70 and 72 comprise a voltage divider to establish the operating points of transistors 60, 62, 64 and 66. Resistors 74 and 76 are connected across the base-emitter junctions of transistors 62 and 66 respectively to increase the breakdown voltage in a manner similar to that described for transistor 52 in the lower totem pole stage.

Dynamically, the circuit operates as described for the previous embodiment, with Zener diode 24 providing bootstrapping to the base of transistor 64. The floating current source comprising resistor 20 maintains constant operating current throughout the dynamic range of the amplifier. Transistors 12, 14, and 18 comprise a current steering circuit to provide charge and discharge paths for the capacitive load 34. A capacitor 80 is connected between the collector of transistor 14 and the base of transistor 16 to achieve optimum damping when the output voltage reaches a new level.

This circuit is particularly suited for fabrication in integratedcircuit form. The Zener diode 24 can be fasioned by connecting a transistor as shown. The only external components required outside the integrated-circuit package would be resistor 48 and capacitor 80. In addition to cost and space spacings over a discrete transistor circuit, a substantial reduction in stray capacitances throughout the circuit is realized.

Figure 3:
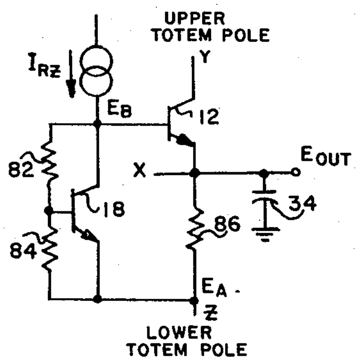
FIG. 3 shows an alternative current steering circuit portion of the preferred embodiment.

FIG. 3 shows an alternative current steering circuit portion of the preferred embodiment which permits a greater distortion-free-amplitude frequency range at a sacrifice in dynamic voltage range at the output terminal 32. The collector of transistor 12 connects into the upper totem pole circuit at point Y, and the emitter thereof connects to the output terminal 32 and to the bootstrapping and feedback circuits at point X. The base of transistor 18 is connected to the junction of a pair of resistors 82 and 84, the other ends of which are connected to the collector and emitter respectively of transistor 18. A constant current $I_{RZ}$ from resistor 20 of the FIG. 2 circuit drives into node $E_B$ at the collector of transistor 18 and base of transistor 12. A resistor 86 replaces transistor 14 of the FIG. 2 circuit, and the junction of resistors 84 and 86 and the emitter of transistor 18 are connected into the lower totem pole circuit at point Z. This junction is also identified as voltage node $E_A$. The current through resistor 84, and hence through resistor 82, is maintained at a constant value established by the base emitter voltage of transistor 18. The voltage across the transistor 18, or $E_b - E_A$, is established by the ratio of resistor 82 plus resistor 84 to resistor 84, multiplied by the $V_{BE}$ of transistor 18. Thus transistor 18 in combination with resistors 82 and 84 functions as a battery providing a substantially constant $E_B - E_A$ value. The desired quiescent current through resistor 86 is equal to the difference between $E_{out}$ and $E_A$ divided by the resistance value of resistor 86. The control of transistor 12 is obtained by varying the voltage across resistor 86 as the lower totem pole current varies.

While I have shown and described a basic circuit and the preferred embodiment of my invention, it will be apparent to those skilled in the art that many changes and modifications may be made without departing from my invention in its broader aspects. For example, the circuit could comprise PNP transistors with suitably chosen supply voltages, and additional transistors could be stacked to increase the voltage swing. While the circuit is described as an amplifier, it is conceivable that it could be operated as a switch because of the current-handling capabilities and the dynamic voltage range capabilities. Also, while it is desirable to drive capacitive loads, resistive loads and even inductive loads can be driven with corresponding changes in currentsupplying behavior.

I claim:

1. An amplifier comprising first amplifying means serially disposed between a first power supply level and a second power supply level and including an output terminal therebetween to which a capacitive load is connected, both of said amplifying means comprising semiconductor means of a single conductivity type, wherein said first amplifying means includes at least a grounded emitter stage and negative feedback means coupled from output to input, said first amplifying means being coupled to receive input signals of opposite polarity and generate an output voltage signal in response thereto, and said second amplifying means includes at least a common collector stage being coupled by bootstrapping means connected between said output terminal and the base of said common collector stage for receiving a voltage signal which is displaced a substantially constant amount from said output voltage signal from said first amplifying means to provide drive thereto so that both of said first and second amplifying means provide a substantially continuous output waveform while being alternately responsive to said input signals, one of said amplifying means conducting current to said capacitive load in response to an input signal of one polarity and the other of said amplifying means conducting current from said capacitive load in response to an input signal of opposite polarity.

2. The amplifier according to claim 1 wherein said negative feedback means includes a third amplifying means comprising an emitter follower stage, wherein the input of said third amplifying means is coupled to receive the output of said first amplifying means, and impedance means coupling the output of said third amplifying means to the input of said first amplifying means.

3. The amplifier according to claim 1 wherein said bootstrapping means includes a Zener diode for displacing said output signal to the operating point of said second amplifying means, said amplifier also including current source means disposed between said first and second amplifying means for producing a substantially constant quiescent operating current for said amplifier, and current steering means serially disposed between first and second amplifying means and having a constant voltage drop thereacross for selecting an output current path through either one of said amplifying means to said capacitive load in response to said output voltage signal.

4. The amplifier according to claim 1 wherein said first and second amplifying means include one or more serially disposed transistor means to thereby increase the dynamic voltage range thereof.

5. An amplifier comprising:

first amplifying means for providing load current in one direction to a capacitive load in response to one polarity of an input signal;

second amplifying means for providing load current in the opposite direction to said load in response to the opposite polarity of said input signal;

bootstrapping means for elevating said second amplifying means to an operating point above said first amplifying means;

current source means disposed between said first and second amplifying means for providing a substantially constant operating current therethrough; and current steering means serially disposed between said first and second amplifying means for selecting the load current path through either of said amplifying means, said current steering means receiving said constant current to maintain a constant voltage thereacross while selecting said load current path.

6. The amplifier according to claim 5 wherein said first amplifying means includes at least a grounded-emitter stage and negative feedback means coupled from output to input, said first amplifying means being coupled to receive said input signals and generate and output voltage signal in response thereto, wherein said second amplifying means includes at least a common collector stage, and wherein said bootstrapping means is connected between the output of said first amplifying means and the input of said second amplifying means to couple said output signal thereacross to provide drive to said second amplifying means.

7. The amplifier according to claim 6 wherein said negative feedback means includes a third amplifying means comprising an emitter follower stage and impedance means, wherein the input of said third amplifying means is coupled to receive the output of said first amplifying means and said impedance means is coupled between the output of said third amplifying means and the input of said first amplifying means.

8. The amplifier according to claim 5 wherein all of the active devices thereof comprise semiconductor means of a single conductivity type.

9. The amplifier according to claim 5 wherein at least one of said first and second amplifying means is rendered conductive throughout the dynamic operating range thereof.

10. The amplifier according to claim 5 wherein said first of said second amplifying means are serially disposed between a first power supply level and a second power supply level.

11. The amplifier according to claim 10 wherein said first and second amplifying means include one or more serially disposed transistor means to provide a desired dynamic voltage range thereof.

* * * * *

UNITED STATES PATENT OFFICE
CERTIFICATE OF CORRECTION

PATENT NO. : 3,868,580

DATED : February 25, 1975

INVENTOR(S) : Carl R. Battjes

It is certified that error appears in the above-identified patent and that said Letters Patent are hereby corrected as shown below:

Column 1, line 32, "curcuit" should be --circuit--

Column 2, line 31, "cna" should be --can--

Column 2, line 36, "supplyinng" should be --supplying--

Column 3, line 34, after "between" insert --resistors--

Column 3, line 55, "$1_{RZ}$" should be --$I_{RZ}$-- occurs two times in the same line.

Column 3, line 67, "$1_{IN}$" should be --$I_{IN}$--

Column 4, line 23, "$1_{IN}$" should be --$I_{IN}$--

Column 4, line 28, "16" should be --18--

Column 4, line 31, "with" should be --without--

Column 4, line 40, " $E_{OUT} = -I_{iN}R_{26}$" should be -- $E_{OUT} = - I_{IN}R_{26}$--

Column 4, line 61, "40" should be -- 48 --.

Column 4, line 62, " $E_{OUT} = I_{iN}R_f$" should be -- $E_{OUT} = I_{IN}R_F$--

UNITED STATES PATENT OFFICE

CERTIFICATE OF CORRECTION

PATENT NO. : 3,868,580

DATED : February 25, 1975

INVENTOR(S) : Carl R. Battjes

It is certified that error appears in the above-identified patent and that said Letters Patent are hereby corrected as shown below:

Column 5, line 61, "tegratedcircuit" should be --tegrated circuit--

Column 5, line 65, "spacings" should be --savings--

Column 6, line 12 "$1_{RZ}$" should be --$I_{RZ}$--

Column 6, line 22, "$E_b - E_A$" should be --$E_B - E_A$--

Column 6, line 46, "currentsupplying" should be --current supplying--

Claim 6, line 5 "and" should be --an--

Claim 10, line 2 "of" should be --and--

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*